United States Patent [19]
Burkhart

[11] Patent Number: 5,764,471
[45] Date of Patent: Jun. 9, 1998

[54] METHOD AND APPARATUS FOR BALANCING AN ELECTROSTATIC FORCE PRODUCED BY AN ELECTROSTATIC CHUCK

[75] Inventor: Vincent E. Burkhart, San Jose, Calif.

[73] Assignee: Applied Materials, Inc., Santa Clara, Calif.

[21] Appl. No.: 639,841

[22] Filed: May 8, 1996

[51] Int. Cl.$^6$ .................................................. H02N 13/00
[52] U.S. Cl. ................................................................ 361/234
[58] Field of Search .............................. 361/230, 233, 361/234; 279/128; 269/8, 903

[56] References Cited

U.S. PATENT DOCUMENTS

| | | | |
|---|---|---|---|
| 3,993,509 | 11/1976 | McGinty | 148/1.5 |
| 4,384,918 | 5/1983 | Abe | 156/643 |
| 4,502,094 | 2/1985 | Lewin et al. | 361/234 |
| 4,554,611 | 11/1985 | Lewin | 361/234 |
| 4,665,463 | 5/1987 | Ward et al. | 361/234 |
| 4,897,171 | 1/1990 | Ohmi | 204/298 |
| 5,001,594 | 3/1991 | Bobbio | 361/234 |
| 5,117,121 | 5/1992 | Watanabe et al. | 307/130 |
| 5,179,498 | 1/1993 | Hongoh et al. | 361/234 |
| 5,310,453 | 5/1994 | Fukusawa et al. | 156/643 |
| 5,459,632 | 10/1995 | Birang et al. | 361/234 |
| 5,460,684 | 10/1995 | Saeki et al. | 156/345 |

FOREIGN PATENT DOCUMENTS

| | | | |
|---|---|---|---|
| 0 452 222 A1 | 10/1991 | European Pat. Off. | H01L 21/00 |
| 0 439 000 B1 | 9/1994 | European Pat. Off. | H02N 13/00 |
| 60-261377 | 12/1985 | Japan | H02N 13/00 |
| 63-194345 | 8/1988 | Japan | H01L 21/68 |
| WO 88/09054 | 11/1988 | WIPO | H01L 21/68 |

*Primary Examiner*—Fritz Fleming
*Attorney, Agent, or Firm*—Thomason & Moser

[57] ABSTRACT

An electrostatic chuck containing apparatus, and a concomitant method, for balancing the electrostatic force that the chuck imparts upon a workpiece. More specifically, the electrostatic chuck contains a chuck body having a pair of coplanar electrodes embedded therein and a wafer spacing mask containing a plurality of conductive support members deposited upon a support surface of the chuck body. The support members maintain a wafer, or other workpiece, in a spaced-part relation with respect to the support surface of the chuck body. Each electrode within the chuck is respectively connected to a terminal dual voltage power supply having a center tap. The center tap of the power supply is connected to the wafer spacing mask. As such, variations in the distance between the wafer and the electrodes due to variations in dielectric thickness, wafer backside roughness, chuck surface roughness, chuck surface conductivity or other physical variations that may cause changes in the electrostatic force are balanced by having the spacing mask connected to the center tap of the power supply.

23 Claims, 1 Drawing Sheet

METHOD AND APPARATUS FOR BALANCING AN ELECTROSTATIC FORCE PRODUCED BY AN ELECTROSTATIC CHUCK

BACKGROUND OF THE DISCLOSURE

1. Field of the Invention

The invention relates to a substrate support chuck for electrostatically retaining a workpiece upon the support surface of the chuck. More particularly, the invention relates to a bipolar electrostatic chuck having apparatus for balancing the electrostatic force applied to a workpiece supported by the chuck.

2. Description of the Background Art

Substrate support chucks are widely used to support substrates within semiconductor processing systems. One example of an electrostatic chuck is described in commonly assigned European Patent Publication Number 0 439 000 B1, published Sep. 14, 1994. This electrostatic chuck has a conventional chuck body containing a dielectric material having a pair of coplanar electrodes embedded therein. The electrodes are half-moon or D-shaped such that each electrode provides clamping force to half the workpiece that is supported by a support surface of the chuck body.

In operation, a chucking voltage is applied to each electrode which causes an electric field to form between the electrodes. This electric field causes charge to distribute on the underside of the wafer that is oppositely polarized to charge located on the chuck surface. The Coulomb force between the charge on the wafer and the charge on the chuck surface attracts the wafer to the chuck. As such, the wafer is retained (clamped) upon the chuck surface.

Ideally, the electrostatic force that retains the wafer should be uniform across the entire underside of the wafer. However, in reality, this electrostatic force may vary substantially across the wafer. The force may vary because of differences in dielectric thickness, wafer backside roughness, chuck surface roughness, variations in chuck surface conductivity and the like. These differences cause an uneven distribution of clamping voltage relative to each electrode.

For example, in a bipolar, dielectric electrostatic chuck such as that described in European Patent discussed above, the combination of the two electrodes and the wafer form, in effect, a pair of series connected capacitors. If, for example, the spacing between the wafer and each of the electrodes is unequal, the voltage drop from one electrode to the wafer (first capacitor) will be different from the voltage drop across the space between the other electrode and the wafer (second capacitor). These unequal voltage drops will cause unequal clamping forces to be applied to each half of the wafer.

As another example, in a bipolar, ceramic electrostatic chuck (e.g., a Johnsen-Rahbek type chuck such as is disclosed in U.S. Pat. No. 5,117,121 issued May 26, 1992), each electrode and the wafer form, in effect, a pair of series connected resistors. If, for example, the spacing between the wafer and each of the electrodes is unequal, the voltage drop from one electrode to the wafer (first resistor) will be different from the voltage drop across the space between the other electrode and the wafer (second resistor). As a result of these unequal voltage drops, unequal clamping forces are applied to each half of the wafer.

One example of apparatus used to balance these electrostatic forces is disclosed in the European Patent cited above. This patent discloses a bipolar dielectric chuck that is driven by a dual power supply. The center tap of the dual power supply is connected to a reference electrode that extends into a plasma that is formed proximate the wafer during wafer processing. As such, the center tap of the power supply attains the plasma voltage, i.e., the power supply voltages that are applied to the electrodes are referenced to the plasma potential. Thus, the wafer, which is generally in contact with the plasma, is indirectly connected to the reference contact. Consequently, an unequal voltage drop from the wafer to each of the electrodes would be adjusted to achieve equal voltages as the center tap voltage changed to compensate for the unequal voltage drops.

However, to achieve this balancing effect, a plasma must be generated proximate the wafer and the reference contact exposed to the plasma. In some semiconductor processing applications, such as physical vapor deposition (PVD) processes, the wafer is processed, e.g., heated, prior to being exposed to a plasma. Thus, the apparatus of the above described chuck that requires the presence of a plasma would not be effective until processing began. As such, the foregoing chuck arrangement is not useful for processes that do not utilize plasmas or do not utilize plasmas for the entire process period.

Therefore, a need exists in the art for apparatus and a concomitant method of automatically balancing the electrostatic force between an electrostatic chuck and a workpiece without relying on the presence of a plasma proximate the workpiece.

SUMMARY OF THE INVENTION

The disadvantages of the prior art are overcome by the present invention of an electrostatic chuck containing apparatus for balancing the electrostatic force which the chuck imparts to a workpiece positioned upon the chuck. More specifically, the invention is a bipolar electrostatic chuck containing a chuck body having a pair of coplanar electrodes embedded therein. Additionally, the chuck includes a wafer spacing mask containing a plurality of support members deposited upon a support surface of the chuck body. The wafer spacing mask is fabricated from a conductive material such as titanium, titanium nitride, stainless steel and the like. The support members maintain a wafer, or other workpiece, in a spaced-part relation with respect to the support surface of the chuck. The distance between the underside surface of the wafer and the chuck is defined by the thickness of the support members.

Each electrode within the bipolar chuck is respectively connected to a terminal of a dual power supply having a center tap. The center tap of the power supply is connected to the wafer spacing mask. As such, variations in the distance between the wafer and the electrodes due to variations in dielectric thickness, wafer backside roughness, chuck surface roughness, chuck surface conductivity or other physical variations that may cause changes in the electrostatic force are balanced by having the spacing mask connected to the center tap of the power supply. In effect, a feedback loop is generated such that an increase in the electrostatic force on one side of the wafer compared to the other side of the wafer will cause a respective increase in the relative value of the center tap voltage. As such, the voltage differential which generates the electrostatic force is maintained constant on both sides of the wafer. When interdigital electrodes are used, the electrostatic force is even more uniformly distributed across the entire underside of the wafer.

After the wafer is processed in the process chamber, the wafer must be "dechucked" before it can be removed from the chuck. Dechucking is accomplished by deactivating the power supplies, e.g., disconnecting the output terminals and center tap respectively from the electrodes and spacing mask. However, the charge accumulated on both the surface of chuck and the underside of the wafer remain even after the power supply is deactivated. To remove this residual charge, both the electrodes and the wafer spacing mask are connected to earth ground. After a short time, the residual charge is removed and the wafer can be easily removed from the chuck.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
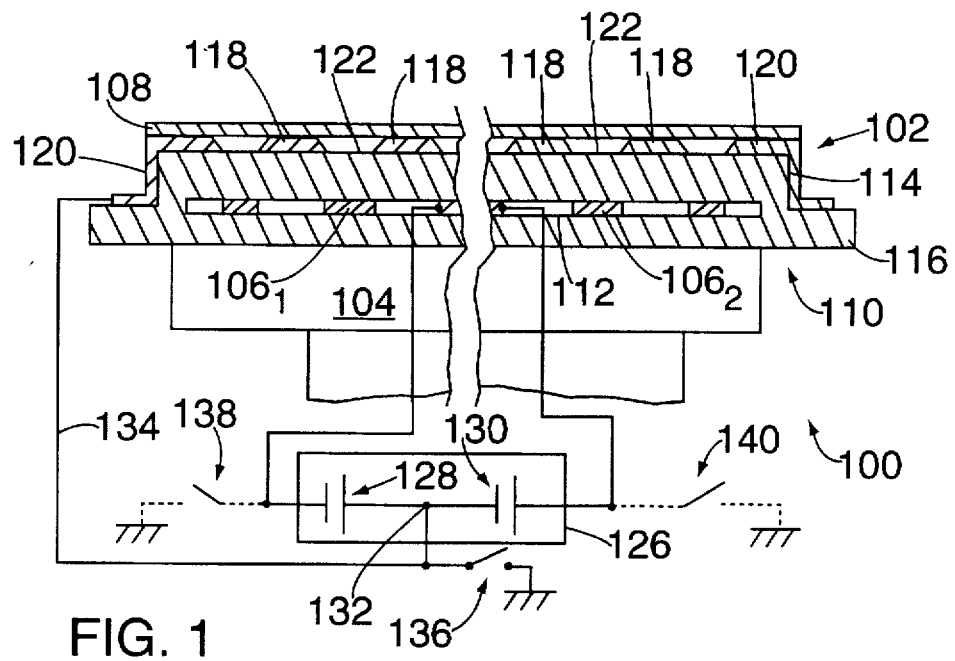
FIG. 1 depicts a vertical cross-sectional view of an electrostatic chuck being biased in accordance with the present invention.
Figure 2:
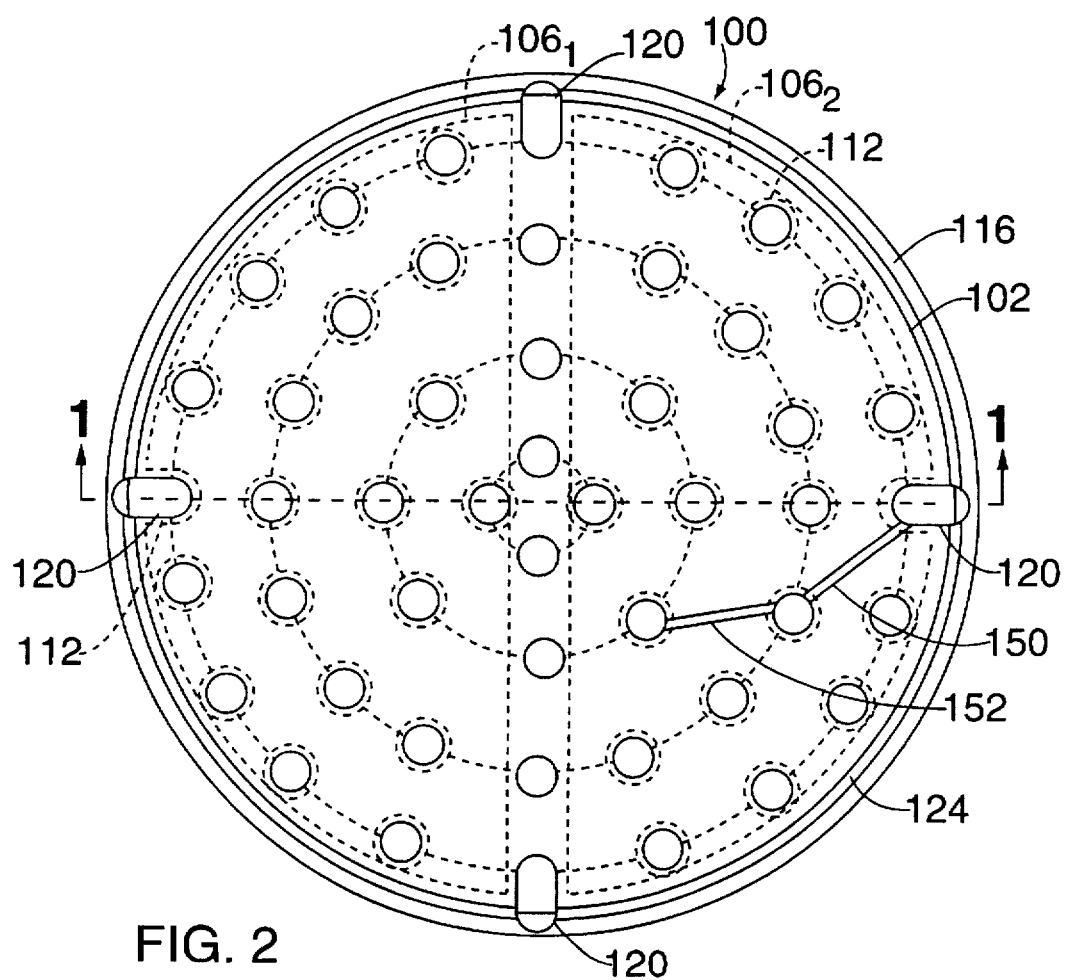
FIG. 2 depicts a top plan view of a pattern for the wafer spacing mask.

FIG. 1 depicts a vertical cross-sectional view of a wafer spacing mask 102 positioned atop a support surface 122 of the chuck body 110 of an electrostatic chuck 100. To illustrate the use of the invention, FIG. 1 depicts a spacing mask 102 supporting a semiconductor wafer 108 as well as a schematic of a power supply 126 used to bias both the electrodes within the chuck as well as a wafer spacing mask. FIG. 2 depicts a top plan view of the wafer spacing mask 102 of FIG. 1 (without the wafer 108). For best understanding of the invention, the reader should refer to both FIGS. 1 and 2 while reading the following disclosure.

In the preferred embodiment, the electrostatic chuck 100 contains at least two electrodes 106 embedded within a ceramic or dielectric chuck body 110. The chuck body is, for example, fabricated of aluminum nitride, boron nitride, or alumina. During high temperature processing, the ceramic materials of the chuck body become partially conductive, thus promoting the Johnsen-Rahbek effect which retains the wafer upon the chuck. If the chuck is to be used at low temperatures only, then either ceramic or dielectric materials are used to form the chuck body. An illustrative ceramic electrostatic chuck is disclosed in U.S. Pat. No. 4,117,121, issued May 26, 1992 herein incorporated by reference. Examples of dielectric electrostatic chucks are disclosed in U.S. Pat. No. 4,184,188 issued Jan. 15, 1980 and U.S. Pat. No. 4,384,918 issued May 24, 1983, both of which are incorporated herein by reference.

The wafer spacing mask 102 is deposited upon the support surface 122 of the chuck body 110, typically using a physical vapor deposition (PVD) process. The material may also be deposited by chemical vapor deposition (CVD), plasma spray deposition, braising, flame spray deposition, and the like. Typically, the material used to form the mask is a metal such as titanium, titanium nitride, stainless steel, and the like.

The spacing mask material is deposited to a pre-defined thickness that maintains the wafer 108, or the workpiece, above the support surface, such that contaminant particles on the support surface 122 do not contact the wafer. An illustrative thickness is approximately 2 microns.

FIG. 2 depicts an illustrative mask pattern having the support members formed as a plurality of spaced-apart pads 118 of deposited material. Each pad 118 has a diameter of approximately 0.25 centimeters (0.1 inches). The concentric rings (shown as dashed lines) are spaced apart by 0.64 centimeters (0.25 inches) and the pads within each ring are spaced from one another by approximately 0.64 centimeters (0.25 inches). Generally speaking, the number, spacing and size of the pads is determined by the amount of clamping force applied by the electrostatic chuck. For example, if the amount of force is large and the pads are spaced relatively distant from one another, the wafer may bow between the pads. On the other hand, placing too many pads on the surface of the chuck could interfere with the electrostatic fields that facilitate the clamping force. Therefore, the pads must be judiciously positioned to optimize support, yet limit their interference with the clamping force.

When using a ceramic chuck at high temperatures, the chuck becomes semiconducting at high temperatures (e.g., 300° C. or more). As such, conductive pads should not be positioned over the electrodes. To produce the Johnsen-Rahbek effect that generates the clamping force, current must be conducted from the wafer to the ceramic chuck. However, these currents must be maintained at a relatively low level to avoid damaging the wafer. As such, the pads are generally positioned between the electrode locations to avoid lying within the highest electrostatic fields and causing substantial amounts of current to flow through the wafer to the mask to wafer contact point. In the embodiment of the invention depicted in FIGS. 1 and 2, the electrode structure (e.g., two half- moon shaped electrodes) contains holes 112 that are concentrically aligned with the spacing mask pads 118. The diameter of each hole 112 is slightly larger (e.g., by approximately 0.25 centimeters (0.1 inches)) than the diameter of a corresponding pad 118. Additionally, minimizing the size of the area of contact between the mask and the wafer also adds and aids in reducing current flow through the wafer.

On the other hand, at low temperatures (e.g., less than 300° C.) the ceramic chuck conducts less current or no current and, for these applications of the invention, the support members can be positioned anywhere on the chuck support surface. Furthermore, the application of the spacing mask on dielectric chucks, the positioning of the support members relative to the electrodes is generally irrelevant. To ensure adequate and uniform support of the wafer above the chuck, the support members should be evenly distributed over the entire surface of the chuck that, absent the spacing mask, would contact the underside of the wafer.

To facilitate connection of the chucking voltage to the wafer, at least one support member 120 is connected to a center tap of the voltage supply 126. Generally speaking, to achieve reliable connection of the power supply to the underside of the wafer, a plurality of support members 120—120 (e.g., four) are connected to one terminal of the voltage supply 126. The conductive connection from the support members 120—120 to the power supply 126 can be accomplished in many ways. The embodiment shown contains four "biased" support members 120—120 that are evenly distributed about the circumference of the chuck body support surface 122. However, to ensure that a connection is made to the wafer, even when a wafer is severely warped, many biased support members (e.g., nine) can be used. Additionally, support members located at inner locations on the chuck body can be interconnected by optional interconnection traces such as traces 150 and 152.

The biased support members 120 that are adapted for connection to the power supply are oval in plan form and "overhang" the support surface 122 of the chuck body. As such, during deposition of the spacing mask, these support members are formed along the support surface 122, the sidewall 114, and flange 116 of the chuck body 105. Furthermore, during deposition, an interconnection trace 124 is formed to interconnect all of the biased support members 120—120. Specifically, the interconnection trace 124 is formed upon the flange 116 and circumscribes the entire chuck body. Of course, additional ones of the support members could be biased by interconnecting selected members with conductive traces deposited upon the surface of the chuck body. To bias the support members 120, the interconnection trace 124 is connected to a conductive wire that is, in turn, connected to one terminal (center tap) of the high voltage power supply 126.

Each electrode is connected to one terminal of a respective power supply within the dual voltage power supply 126. Electrode $106_1$ is connected to the negative terminal of power supply 128 while electrode $106_2$ is connected to the positive terminal of power supply 130. The negative terminal of power supply 128 and the positive terminal of power supply 130 are connected to one another forming a common terminal or center tap 132. This center tap is connected to the wafer spacing mask 102 via a wire 134. The distal end of wire 134 is connected to the interconnection trace 124 such that the potential at the center tap is applied to the "biased" support members 120—120. As such, a common terminal on the flange 116 of the chuck body 110 interconnects all of the biased support members 120—120 of the wafer spacing mask 102. A typical voltage for each power supply is 300 volts DC.

In operation, as the wafer is chucked, the floating center tap voltage will ensure that the voltage applied between the wafer and each of the electrodes is relatively equal such that the electrostatic force retaining the wafer will be balanced. The floating center tap voltage adjusts to maintain equal voltage drops for each electrode to the wafer. Thus, the electrostatic force retaining the wafer will self-balance. As such, the force across the entire surface of the wafer is maintained at a substantially uniform magnitude.

When the wafer is to be removed from the chuck, i.e., dechucked, the power supply 126 is deactivated. However, a residual charge remains on the wafer and the support surface of the chuck. This residual charge retains the wafer upon the chuck. To "bleed off" or discharge the residual charge, switch 136 is provided. Switch 136 is connected between the center tap 132 and earth ground. This switch, when closed, connects the biased support elements 120 as well as the electrodes 106 to earth ground. The support elements 120 are connected directly to ground, while the electrodes are coupled to ground through the respective power supplies (a relatively low impedance). As such, the residual charge is relatively quickly eliminated and the wafer can be removed from the chuck.

Alternatively, two switches 138 and 140 can be used to directly connect the electrodes 106 to ground and the mask to ground through the power supplies. This arrangement will also eliminate the residual charge. Also, all three switches 136, 138 and 140 could be used to connect the mask and the electrodes directly to ground, thus avoiding discharge through the power supply impedance.

Many alternative dechucking techniques are available for achieving rapid elimination of residual charge on a bipolar chuck. For example, U.S. Pat. No. 5,459,632 issued Oct. 17, 1995, incorporated herein by reference, discloses an alternative dechucking method that applies particular dechucking voltage levels to the electrodes to optimally draining the residual charge. This active dechucking technique, as well as others, may find use as part of the present invention.

Although various embodiments which incorporate the teachings of the present invention have been shown and described in detail, those skilled in the art can readily devise many other varied embodiments that still incorporate these teachings.

What is claimed is:

1. A bipolar electrostatic chuck for retaining a workpiece comprising:
    a chuck body containing at least two electrodes and having a surface; and
    a wafer spacing mask of conductive material disposed over said surface of said chuck body, where said wafer spacing mask is adapted for connection to a power supply.

2. The bipolar electrostatic chuck of claim 1 wherein said wafer spacing mask further comprises:
    a plurality of support members for supporting said workpiece in a spaced apart relation with respect to said surface of said chuck body, where at least one of said support members in said plurality of support members is adapted for connection to a power supply.

3. The bipolar electrostatic chuck of claim 2 wherein said at least one of said support members that is adapted for connection to the power supply is positioned proximate an edge of said chuck body.

4. The bipolar electrostatic chuck of claim 3 wherein said at least one of said support members that is adapted for connection to the power supply comprises a subset of said plurality of support members.

5. The bipolar electrostatic chuck of claim 4 wherein each support member in said subset of said plurality of support members is located proximate an edge of said chuck body and overhangs the edge, where a first portion of each support member in said subset contacts said workpiece and a second portion of each support member in said subset receives a connection to the power supply.

6. The bipolar electrostatic chuck of claim 5 wherein each of said support members in said subset of said plurality of support members is interconnected by an interconnection trace.

7. The bipolar electrostatic chuck of claim 2 further comprising an interconnection trace that connects said at least one of said support members that is adapted for connection to the power supply to at least one other support member.

8. Apparatus for retaining a workpiece comprising:
    a bipolar electrostatic chuck comprising a chuck body containing at least two electrodes and having a surface;
    a wafer spacing mask of conductive material disposed over said surface of said chuck body; and
    a dual power supply having a first terminal, a second terminal and a center tap, where said first terminal is connected to a first electrode of said bipolar electrostatic chuck, said second terminal is connected to a second electrode of said bipolar electrostatic chuck and said center tap is connected to said wafer spacing mask.

9. The apparatus of claim 8 wherein said wafer spacing mask further comprises:
    a plurality of support members for supporting said workpiece in a spaced apart relation with respect to said surface of said chuck body, where at least one of said support members in said plurality of support members is connected to said power supply.

10. The apparatus of claim 9 wherein said at least one of said support members that is connected to said power supply is positioned proximate an edge of said chuck body.

11. The apparatus of claim 10 wherein said at least one of said support members that is adapted for connection to said power supply comprises a subset of said plurality of support members.

12. The apparatus of claim 11 wherein each support member in said subset of said plurality of support members is located proximate an edge of said chuck body and overhangs the edge, where a first portion of each support member in said subset contacts said workpiece and a second portion of each support member in said subset is connected to said power supply.

13. The apparatus of claim 12 wherein each of said support members in said subset of said plurality of support members is interconnected by an interconnection trace.

14. The apparatus of claim 9 further comprising an interconnection trace that connects said at least one of said support member that is connected to said power supply to at least one other support member.

15. The apparatus of claim 9 wherein said dual power supply comprises:

a first power supply having a positive terminal and a negative terminal; and a second power supply having a positive terminal and a negative terminal, where said first power supply positive terminal forms said first terminal, said second power supply negative terminal forms said second terminal and said first power supply negative terminal and said second power supply positive terminal are connected to one another to form the center tap.

16. The apparatus of claim 9 further comprising a dechucking means, connected between said center tap and ground, for selectively connecting said center tap to ground to discharge residual charge from the electrodes and the wafer spacing mask.

17. The apparatus of claim 9 further comprising a dechucking means, connected from said second terminal to ground and from said first terminal to ground, for selectively connecting said first and second terminals to ground to discharge residual charge from the electrodes and the wafer spacing mask.

18. The apparatus of claim 9 further comprising a dechucking means, connected from said second terminal to ground, from said first terminal to ground and from said center tap to ground, for selectively connecting said first and second terminals to ground to discharge residual charge from the electrodes and the wafer spacing mask.

19. In an electrostatic chuck system containing an electrostatic chuck having a pair of electrodes embedded within a chuck body and a conductive wafer spacing mask deposited upon a support surface of the chuck body, the electrostatic chuck is driven by a dual power supply having a first terminal, a second terminal and a center tap, where said first terminal is connected to a first electrode of said electrostatic chuck, said second terminal is connected to a second electrode of said electrostatic chuck and said center tap is connected to said wafer spacing mask, a method for retaining a workpiece upon said electrostatic chuck comprising the steps of:

positioning said workpiece upon said wafer spacing mask;

activating said dual power supply to apply predefined voltage to said first and second electrodes; and automatically balancing a voltage differential between a voltage at said center tap and said predefined voltages at said first and second electrodes, where said voltage balancing balances a retention force across the workpiece.

20. The method of claim 19 further comprising a step of dechucking said workpiece from said electrostatic chuck.

21. The method of claim 20 wherein said dechucking step further comprises:

deactivating said dual power supply; and connecting said center tap to ground to discharge residual charge remaining upon said workpiece and said pair of electrodes.

22. The method of claim 20 wherein said dechucking step further comprises:

deactivating said dual power supply; and connecting said pair of electrodes to ground to discharge residual charge remaining upon said workpiece and said pair of electrodes.

23. The method of claim 20 wherein said dechucking step further comprises:

deactivating said dual power supply; and connecting said center tap and said pair of electrodes to ground to discharge residual charge remaining upon said workpiece and said pair of electrodes.

* * * * *